US008569792B2

(12) United States Patent
Mitani et al.

(10) Patent No.: US 8,569,792 B2
(45) Date of Patent: Oct. 29, 2013

(54) SILICONE RESIN SHEET, PRODUCING METHOD THEREOF, ENCAPSULATING SHEET, AND LIGHT EMITTING DIODE DEVICE

(75) Inventors: Munehisa Mitani, Osaka (JP); Hiroyuki Katayama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/605,632

(22) Filed: Sep. 6, 2012

(65) Prior Publication Data

US 2013/0069106 A1    Mar. 21, 2013

(30) Foreign Application Priority Data

Sep. 21, 2011 (JP) ................................. 2011-206291

(51) Int. Cl.
*H01L 33/00* (2010.01)
*B05D 7/00* (2006.01)

(52) U.S. Cl.
USPC ................. 257/100; 257/E33.059; 427/407.1

(58) Field of Classification Search
CPC ... H01L 33/62; H01L 33/486; H01L 25/0753; B05D 7/532; B05D 5/068; C09D 175/04; C08L 83/04; C08G 18/61; C08G 77/20
USPC ....... 257/100, 791, E33.059; 427/387, 407.1, 427/96.6; 525/474, 477, 479
See application file for complete search history.

(56) References Cited

U.S. PATENT DOCUMENTS

| | | | | | |
|---|---|---|---|---|---|
| 4,558,109 | A | * | 12/1985 | McAfee | 528/15 |
| 4,754,013 | A | * | 6/1988 | Antonen | 528/15 |
| 5,545,700 | A | * | 8/1996 | Mealey et al. | 525/478 |
| 5,696,209 | A | * | 12/1997 | King et al. | 525/478 |
| 5,804,631 | A | * | 9/1998 | Mine et al. | 524/440 |
| 2010/0148378 | A1 | * | 6/2010 | Katayama et al. | 257/791 |
| 2011/0248312 | A1 | | 10/2011 | Katayama | |

FOREIGN PATENT DOCUMENTS

| | | | |
|---|---|---|---|
| EP | 2 196 503 A1 | 6/2010 | |
| EP | 2 365 034 A2 | 9/2011 | |
| JP | 2007-123452 * | 5/2007 | ............. H01L 33/00 |
| JP | 2008-291232 A | 12/2008 | |
| JP | 2011-219597 A | 11/2011 | |

OTHER PUBLICATIONS

European Search Report issued in Application No. 12183862.7 dated Nov. 9, 2012.

* cited by examiner

*Primary Examiner* — Nikolay Yushin
(74) *Attorney, Agent, or Firm* — Sughrue Mion, PLLC

(57) ABSTRACT

A method for producing a silicone resin sheet includes the steps of forming a first coating layer by applying a first silicone resin composition which contains a first organopolysiloxane and a second organopolysiloxane; forming a precursor layer from the first coating layer by reacting the first organopolysiloxane with the second organopolysiloxane so as to have a conversion ratio of 5 to 40%; and forming a second layer on at least one surface in a thickness direction of the precursor layer by applying a second silicone resin composition which contains a third organopolysiloxane, a fourth organopolysiloxane, a hydrosilylation catalyst, and a curing retardant containing tetraalkylammonium hydroxide.

11 Claims, 2 Drawing Sheets

(a)

(b)

(a)

(b)

SILICONE RESIN SHEET, PRODUCING METHOD THEREOF, ENCAPSULATING SHEET, AND LIGHT EMITTING DIODE DEVICE

CROSS-REFERENCE TO RELATED APPLICATION

The present application claims priority from Japanese Patent Application No. 2011-206291 filed on Sep. 21, 2011, the contents of which are hereby incorporated by reference into this application.

BACKGROUND OF THE INVENTION

1. Field of the Invention

The present invention relates to a silicone resin sheet, a producing method thereof, an encapsulating sheet, and a light emitting diode device, to be specific, to a method for producing a silicone resin sheet, a silicone resin sheet obtained by the method, an encapsulating sheet made of the silicone resin sheet, and a light emitting diode device in which a light emitting diode element is encapsulated by the encapsulating sheet.

2. Description of Related Art

It has been known that a silicone resin sheet formed from a silicone resin (a silicone elastomer material) having an excellent light resistance and heat resistance into a sheet shape is used in various uses.

For example, a method in which after applying a mixture of an addition reaction curable type silicone gel material mainly composed of an organopolysiloxane and an addition reaction curable type silicone rubber material mainly composed of an organopolysiloxane onto a substrate in a sheet shape, the mixture is cured by heating at 150° C. for 5 minutes, so that a silicone gel sheet is produced has been proposed (ref: for example, Japanese Unexamined Patent Publication No. 2008-291232).

SUMMARY OF THE INVENTION

However, there may be a case where a silicone resin sheet is required to be formed of a plurality of layers having different functions in accordance with its use and purpose. In such a case, a method in which the mixture in Japanese Unexamined Patent Publication No. 2008-291232 is applied to the upper surface of a lower side silicone resin layer formed in a sheet shape in advance to be then cured by heating, so that an upper side silicone resin layer is formed has been tentatively proposed.

However, in the silicone resin sheet obtained by the tentative proposal, there is a disadvantage that a peeling easily occurs at the interfacial surface between the upper side silicone resin layer and the lower side silicone resin layer.

It is an object of the present invention to provide a silicone resin sheet in which an interfacial peeling between a first layer and a second layer is effectively suppressed, a producing method thereof, an encapsulating sheet made of the silicone resin sheet, and a light emitting diode device in which a light emitting diode element is encapsulated by the encapsulating sheet.

A method for producing a silicone resin sheet of the present invention includes the steps of forming a first coating layer by applying a first silicone resin composition which contains a first organopolysiloxane having at least two alkenylsilyl groups in one molecule and a second organopolysiloxane having at least two hydrosilyl groups in one molecule; forming a precursor layer from the first coating layer by reacting the first organopolysiloxane with the second organopolysiloxane so as to have a conversion ratio of 5 to 40%; and forming a second layer on at least one surface in a thickness direction of the precursor layer by applying a second silicone resin composition which contains a third organopolysiloxane having at least two alkenylsilyl groups in one molecule, a fourth organopolysiloxane having at least two hydrosilyl groups in one molecule, a hydrosilylation catalyst, and a curing retardant containing tetraalkylammonium hydroxide.

In the method for producing a silicone resin sheet of the present invention, it is preferable that in the step of forming the precursor layer, the first organopolysiloxane is reacted with the second organopolysiloxane by heating the first coating layer.

In the method for producing a silicone resin sheet of the present invention, it is preferable that in the step of forming the precursor layer, the first organopolysiloxane is reacted with the second organopolysiloxane by heating the first coating layer at 80 to 110° C. for 3 to 8 minutes.

In the method for producing a silicone resin sheet of the present invention, it is preferable that the step of semi-curing the second layer is further included.

In the method for producing a silicone resin sheet of the present invention, it is preferable that the alkenylsilyl group is a vinylsilyl group.

In the method for producing a silicone resin sheet of the present invention, it is preferable that the first silicone resin composition or the second silicone resin composition contains a functionality-imparting agent.

In the method for producing a silicone resin sheet of the present invention, it is preferable that the first silicone resin composition contains a first functionality-imparting agent and the second silicone resin composition contains a second functionality-imparting agent which has a different function from that of the first functionality-imparting agent.

A silicone resin sheet of the present invention includes a first layer formed by reacting a first silicone resin composition which contains a first organopolysiloxane having at least two alkenylsilyl groups in one molecule and a second organopolysiloxane having at least two hydrosilyl groups in one molecule so as to have a conversion ratio of 5 to 40% and a second layer laminated on at least one surface in a thickness direction of the first layer and formed from a second silicone resin composition which contains a third organopolysiloxane having at least two alkenylsilyl groups in one molecule, a fourth organopolysiloxane having at least two hydrosilyl groups in one molecule, a hydrosilylation catalyst, and a curing retardant containing tetralkylammonium hydroxide.

In the silicone resin sheet of the present invention, it is preferable that the second layer is in a semi-cured state.

An encapsulating sheet of the present invention is made of the above-described silicone resin sheet.

A light emitting diode device of the present invention includes a board, a light emitting diode element mounted on the board, and the above-described encapsulating sheet formed on one surface in a thickness direction of the board so as to encapsulate the light emitting diode element.

In the method for producing a silicone resin sheet of the present invention, the first organopolysiloxane and the second organopolysiloxane are reacted so as to have a conversion ratio of 5 to 40%, so that the precursor layer is formed from the first coating layer and the second silicone resin composition is applied on at least one surface of the precursor layer to form the second layer. Therefore, on at least one surface of the precursor layer, the unconverted first organopolysiloxane and/or second organopolysiloxane, and the third organopolysiloxane and fourth organopolysiloxane can be reacted with each other.

Thus, the adhesiveness of the first layer to the second layer in the silicone resin sheet of the present invention can be improved, so that the interfacial peeling between the first layer and the second layer can be effectively suppressed.

As a result, the long-term reliability of the encapsulating sheet of the present invention made of the silicone resin sheet of the present invention and the light emitting diode device in which the light emitting diode element is encapsulated by the encapsulating sheet of the present invention can be improved.

DETAILED DESCRIPTION OF THE INVENTION

First Embodiment

Figure 1:
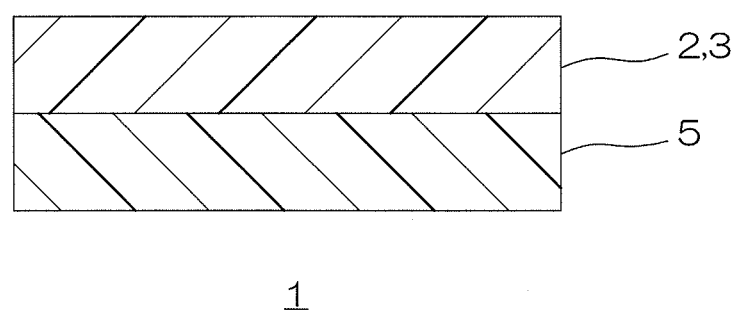
FIG. 1 shows process drawings for illustrating a first embodiment of a method for producing a silicone resin sheet of the present invention:
(a) illustrating a step of forming a precursor layer and
(b) illustrating a step of forming a second layer to produce a silicone resin sheet.
Figure 1:
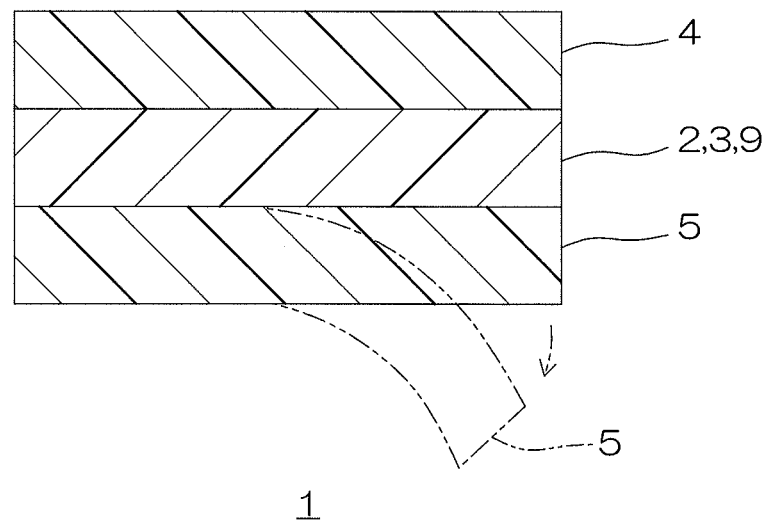

A method for producing a silicone resin sheet includes the steps of forming a first coating layer by applying a first silicone resin composition, forming a precursor layer from the first coating layer, and forming a second layer on the upper surface (one surface in the thickness direction) of the precursor layer by applying a second silicone resin composition. In addition, the method for producing a silicone resin sheet includes the step of semi-curing the second layer.

The first silicone resin composition is an addition reaction curable type silicone resin composition and contains a first organopolysiloxane having an alkenylsilyl group and a second organopolysiloxane having a hydrosilyl group.

The first organopolysiloxane is blended in the addition reaction curable type silicone resin composition as a main agent and in view of forming a cross-link, has at least two alkenylsilyl groups in one molecule.

The alkenylsilyl group is a group in which an alkenyl group is bonded to a silicon atom and the arrangement of the alkenylsilyl group may be any of at an end of a molecule, in the main chain, or in a side chain.

Examples of the alkenyl group include a substituted or unsubstituted alkenyl group. The structure of the alkenyl group may be a straight chain, a branched chain, or cyclic as long as it is an organic group containing an alkenyl group in a skeleton. The number of carbon atoms of the organic group is, in view of transparency and heat resistance, preferably 1 to 20, or more preferably 1 to 10. To be specific, examples of the alkenyl group include a vinyl group, an allyl group, a propenyl group, a butenyl group, a pentenyl group, a hexenyl group, a heptenyl group, an octenyl group, a norbornenyl group, and a cyclohexenyl group. Of these, in view of reactivity with respect to a hydrosilylation reaction, preferably, a vinyl group is used.

That is, as the alkenylsilyl group, pereferably, a vinylsilyl group ($CH_2$=CH—Si—) is used.

The organic group bonded to a silicon atom, other than the alkenyl group, is not particularly limited and an example thereof includes a monovalent hydrocarbon group.

Examples of the monovalent hydrocarbon group include a straight chain, a branched chain, or a cyclic saturated hydrocarbon group or aromatic hydrocarbon group. The number of carbon atoms of the hydrocarbon group is, in view of transparency and heat resistance, preferably 1 to 20, or more preferably 1 to 10. To be specific, examples of the monovalent hydrocarbon group include a methyl group, an ethyl group, a propyl group, a butyl group, a pentyl group, a hexyl group, a phenyl group, a naphthyl group, a cyclohexyl group, and a cyclopentyl group. Of these, in view of transparency, heat resistance, and light resistance of the obtained resin composition, preferably, a methyl group and a phenyl group are used, or more preferably, a methyl group is used.

To be specific, examples of the first organopolysiloxane include a straight chain structure of vinyl-terminated polydimethylsiloxane(dimethylvinylsilyl-terminated polydimethylsiloxane), vinyl-terminated dimethylsiloxane-diphenylsiloxane copolymer, vinyl-terminated poly(methyl)(phenyl)siloxane, vinyl-terminated dimethylsiloxane-diethylsiloxane copolymer, trimethylsiloxy-terminated dimethylsiloxane-methyl(vinyl)siloxane copolymer, vinyl-terminated dimethylsiloxane-methyl(vinyl)siloxane copolymer, and trimethylsiloxy-terminated poly(methyl)(vinyl)siloxane. In addition to the above-described straight chain structure, examples of the molecular structure of the first organopolysiloxane include a cyclic chain structure, a branched chain structure, or a three dimensional network structure. These can be used alone or in combination of two or more.

A commercially available product can be used as the first organopolysiloxane. A first organopolysiloxane synthesized in accordance with a known method can be also used.

The number average molecular weight (GPC measurement with standard polystyrene calibration) of the first organopolysiloxane is, for example, 10000 to 100000, or preferably 15000 to 50000.

The alkenylsilyl functional group equivalent in the first organopolysiloxane is, in view of toughness and flexibility of the cured product, preferably 0.005 to 10 mmol/g, or more preferably 0.010 to 5 mmol/g. The functional group equivalent in the first organopolysiloxane is the number of moles of alkenylsilyl group per 1 g of the first organopolysiloxane and can be measured by a 1H-NMR using an internal standard substance. The functional group equivalent in the other organopolysiloxanes to be described later can be also measured in the same manner.

The viscosity of the first organopolysiloxane at 25° C. is, in view of toughness of the cured product, preferably 100 to 500000 mPa·s, or more preferably 300 to 100000 mPa·s. The viscosity can be measured by using a B-type viscometer. The viscosity of the other organopolysiloxanes to be described later can be also measured in the same manner.

The content of the first organopolysiloxane in the first silicone resin composition is, for example, 0.1 to 99.9 mass %, or preferably 1 to 99 mass %.

The second organopolysiloxane is blended in the addition reaction curable type silicone resin composition as a cross-linking agent and in view of forming a cross-link, has at least two hydrosilyl groups in one molecule.

The hydrosilyl group is a group (—SiH) in which a hydrogen atom is bonded to a silicon atom and the arrangement of the hydrosilyl group may be any of at an end of a molecule, in the main chain, or in a side chain.

The organic group bonded to a silicon atom, other than the hydrosilyl group, is not particularly limited and an example thereof includes a monovalent hydrocarbon group.

An example of the monovalent hydrocarbon group includes the same monovalent hydrocarbon group as that in the above-described first organopolysiloxane. Of these, in view of transparency, heat resistance, and light resistance of the obtained first silicone resin composition, preferably, a methyl group and a phenyl group are used, or more preferably, a methyl group is used.

To be specific, examples of the second organopolysiloxane include a straight chain structure of dimethylsilyl-terminated polydimethylsiloxane, dimethylsilyl-terminated dimethylsiloxane-diphenylsiloxane copolymer, dimethylsilyl-terminated poly(methyl)(phenyl)siloxane, dimethylsilyl-terminated dimethylsiloxane-diethylsiloxane copolymer, trimethylsiloxy-terminated dimethylsiloxane-methyl(hydro)siloxane copolymer (trimethylsilyl-terminated dimethylsiloxane-methylhydrosiloxane copolymer), and trimethylsiloxy-terminated poly(methyl)(hydro)siloxane. In addition to the above-described straight chain structure, examples of the molecular structure of the second organopolysiloxane include a cyclic chain structure, a branched chain structure, or a three dimensional network structure. These can be used alone or in combination of two or more.

A commercially available product can be used as the second organopolysiloxane. A second organopolysiloxane synthesized in accordance with a known method can be also used.

The number average molecular weight (GPC measurement with standard polystyrene calibration) of the second organopolysiloxane is, for example, 500 to 5000, or preferably 1000 to 3000.

The hydrosilyl functional group equivalent in the second organopolysiloxane is, in view of toughness and flexibility of the cured product, preferably 0.005 to 10 mmol/g, or more preferably 0.010 to 5 mmol/g.

The viscosity of the second organopolysiloxane at 25° C. is, in view of toughness of the cured product, preferably 5 to 500000 mPa·s, or more preferably 10 to 100000 mPa·s.

The content of the second organopolysiloxane in the first silicone resin composition is preferably 0.1 to 99.9 mass %, or more preferably 1 to 99 mass %.

The content of the second organopolysiloxane with respect to 100 parts by mass of the first organopolysiloxane is, in view of toughness of the cured product, preferably 0.1 to 1000 parts by mass, more preferably 1 to 100 parts by mass, even more preferably 1 to 10 parts by mass, or particularly preferably 1 to 5 parts by mass.

In the first silicone resin composition, in the molar ratio of the first organopolysiloxane to the second organopolysiloxane, the molar ratio (the alkenylsilyl group/the hydrosilyl group) of the above-described functional groups is preferably 1/50 to 50/1, more preferably 1/5 to 5/1, or even more preferably 1/2 to 2/1, and substantially is 1/1.

The second silicone resin composition is an addition reaction curable type silicone resin composition and contains a third organopolysiloxane, a fourth organopolysiloxane, a hydrosilylation catalyst, and a curing retardant containing tetraalkylammonium hydroxide.

An example of the third organopolysiloxane includes the examples of the first organopolysiloxane described above.

The content of the third organopolysiloxane in the second silicone resin composition is, for example, 0.1 to 99.9 mass %, or preferably 1 to 99 mass %.

An example of the fourth organopolysiloxane includes the examples of the second organopolysiloxane described above.

The content of the fourth organopolysiloxane in the second silicone resin composition is, for example, 0.1 to 99.9 mass %, or preferably 1 to 99 mass %.

The content of the fourth organopolysiloxane with respect to 100 parts by mass of the third organopolysiloxane is, in view of toughness of the cured product, preferably 0.1 to 1000 parts by mass, more preferably 1 to 100 parts by mass, even more preferably 1 to 10 parts by mass, or particularly preferably 1 to 5 parts by mass.

In the second silicone resin composition, in the molar ratio of the third organopolysiloxane to the fourth organopolysiloxane, the molar ratio (the alkenylsilyl group/the hydrosilyl group) of the above-described functional groups is preferably 1/50 to 50/1, more preferably 1/5 to 5/1, or even more preferably 1/2 to 2/1.

The hydrosilylation catalyst is not particularly limited as long as it is a compound which catalyzes a hydrosilylation reaction of the alkenylsilyl group with the hydrosilyl group. Examples of the hydrosilylation catalyst include a platinum catalyst such as platinum black, platinum chloride, chloroplatinic acid, a platinum olefin complex including a platinum divinyltetramethyldisiloxane complex, a platinum carbonyl complex, and platinum acetyl acetate; a palladium catalyst; and a rhodium catalyst. Of these, in view of compatibility, transparency, and catalyst activity, preferably, a platinum olefin complex is used, or more preferably, a platinum divinyltetramethyldisiloxane complex is used.

In the content of the hydrosilylation catalyst, for example, when the platinum catalyst is used, in view of curing rate, the content of the platinum with respect to 100 parts by mass of the third organopolysiloxane is preferably $1.0 \times 10^{-4}$ to 0.5 parts by mass, or more preferably, $1.0 \times 10^{-3}$ to 0.05 parts by mass.

The curing retardant contains, as an essential component, tetraalkylammonium hydroxide.

The tetraalkylammonium hydroxide has a suppressing effect on curing with respect to the hydrosilylation catalyst. The tetraalkylammonium hydroxide is a hydroxide of ammonium having four alkyl groups (straight chain, branched chain, or cyclic saturated hydrocarbon groups) which may have the same or different substituted groups with each other.

To be specific, examples of the tetraalkylammonium hydroxide include tetra-unsubstituted alkylammonium hydroxide such as tetramethylammonium hydroxide (TMAH), tetraethylammonium hydroxide, tetrapropylammonium hydroxide, tetrabutylammonium hydroxide, tetrahexylammonium hydroxide, tetradecylammonium hydroxide, and hexadecyltrimethylammonium hydroxide and tetra-substituted alkylammonium hydroxide such as tetra(2-hydroxyethyl)ammonium hydroxide and benzyltrimethylammonium hydroxide.

These are used alone or in combination of two or more.

A commercially available product can be used as the tetraalkylammonium hydroxide. A tetraalkylammonium hydroxide synthesized in accordance with a known method can be also used.

As the tetraalkylammonium hydroxide, in view of availability, heat resistance, and control function of the curing reaction, preferably, tetramethylammonium hydroxide (TMAH) and tetrabutylammonium hydroxide are used.

The tetraalkylammonium hydroxide can be used in any state such as a solid state, a solution state, or the like. In view of dispersibility into a silicone resin, preferably, the tetraalkylammonium hydroxide in a solution state is used.

In a case where the tetraalkylammonium hydroxide is used as a solution, the solvent thereof is not particularly limited. An example of the solvent includes a monohydric alcohol such as methanol and ethanol.

The content of the tetraalkylammonium hydroxide is, in view of balance of storage stability and curing properties in a semi-cured state, preferably 1 to 1000 mol, or more preferably 10 to 500 mol with respect to 1 mol of the hydrosilylation catalyst.

The curing retardant can contain, as an optional component, another curing retardant (a curing retardant excluding the tetraalkylammonium hydroxide).

Another curing retardant is not particularly limited as long as it is a compound which has a suppressing effect on curing with respect to the hydrosilylation catalyst. Examples thereof include an acetylene compound, an olefin compound, a phosphorus compound, a nitrogen compound, a sulfur compound, and an organic peroxide. To be specific, examples thereof include an acetylene compound such as 1-ethynylcyclohexanol and 3-methyl-1-butyne-3-ol; an olefin compound such as 1,3,5,7-tetravinyl-1,3,5,7-tetramethylcyclotetrasiloxane, and dimethyl maleate; a phosphorus compound such as triphenylphosphine; a nitrogen compound such as tributylamine, tetramethylethylenediamine, imidazole, and benzotriazole; a sulfur compound such as benzothiazole; and an organic peroxide.

These other curing retardants can be used alone or in combination of two or more.

In a case where another curing retardant is blended, the mixing proportion is appropriately set according to its purpose and use.

The first silicone resin composition and the second silicone resin composition can be respectively prepared by mixing the above-described components.

The viscosity of the first silicone resin composition at 25° C. is adjusted to be, in view of handling ability, for example, 100 to 500000 mPa·s, or more preferably 300 to 100000 mPa·s.

In the second silicone resin composition, for example, a functionality-imparting agent is contained.

In the first embodiment, the first silicone resin composition is prepared only from the first organopolysiloxane and the second organopolysiloxane without allowing the first silicone resin composition to contain the functionality-imparting agent.

The functionality-imparting agent is not particularly limited as long as it is an agent which is capable of imparting a desired function to the second silicone resin composition. An example thereof includes an inorganic particle such as a phosphor, a light reflecting component, and a filler.

An example of the phosphor includes a yellow phosphor which is capable of converting blue light to yellow light (having a wavelength conversion function). An example thereof includes a phosphor obtained by doping a metal atom such as cerium (Ce) or europium (Eu) into a composite metal oxide, a metal sulfide, or the like.

To be specific, examples of the phosphor include a garnet type phosphor having a garnet type crystal structure such as $Y_3Al_5O_{12}$:Ce (YAG (yttrium aluminum garnet):Ce), (Y, Gd)$_3$Al$_5$O$_{12}$:Ce, Tb$_3$Al$_3$O$_{12}$:Ce, Ca$_3$Sc$_2$Si$_3$O$_{12}$:Ce, and Lu$_2$CaMg$_2$(Si, Ge)$_3$O$_{12}$:Ce; a silicate phosphor such as (Sr, Ba)$_2$SiO$_4$ (BOS (barium orthosilicate)):Eu, Ca$_3$SiO$_4$Cl$_2$:Eu, Sr$_3$SiO$_5$:Eu, Li$_2$SrSiO$_4$:Eu, and Ca$_3$Si$_2$O$_7$:Eu; an aluminate phosphor such as CaAl$_{12}$O$_{19}$:Mn and SrAl$_2$O$_4$:Eu; a sulfide phosphor such as ZnS:Cu,Al, CaS:Eu, CaGa$_2$S$_4$:Eu, and SrGa$_2$S$_4$:Eu; an oxynitride phosphor such as CaSi$_2$O$_2$N$_2$:Eu, SrSi$_2$O$_2$N$_2$:Eu, BaSi$_2$O$_2$N$_2$:Eu, and Ca-α-SiAlON; a nitride phosphor such as CaAlSiN$_3$:Eu and CaSi$_5$N$_8$:Eu; and a fluoride-based phosphor such as K$_2$SiF$_6$:Mn and K$_2$TiF$_6$:Mn. Preferably, in view of conversion characteristics of converting blue light to yellow light, a garnet type phosphor and a silicate phosphor are used, or more preferably, in view of conversion efficiency, YAG:Ce and BOS:Eu are used.

These phosphors can be used alone or in combination of two or more.

The phosphor is in the form of a particle. The shape thereof is not particularly limited and examples of the shape thereof include a sphere shape, a flat plate shape, and a needle shape.

The average value of the maximum length (in the case of a sphere shape, the average particle size) of the phosphor is, for example, 0.1 to 500 μm, or preferably 0.2 to 200 μm. The average particle size of the phosphor particle is measured by using a laser diffraction scattering particle size analyzer.

The mixing proportion of the phosphor is appropriately adjusted in accordance with quantum efficiency and scattering properties of the phosphor and is adjusted so as to have a predetermined color tone such as white. To be specific, the mixing ratio of the phosphor with respect to the second silicone resin composition is, for example, 1 to 50 mass %, or for example, 10 to 40 mass %.

The light reflecting component is blended so as to improve the light reflectivity in the second silicone resin composition. An example of the light reflecting component is a white compound. To be specific, an example of the white compound includes a white pigment.

An example of the white pigment includes a white inorganic pigment. Examples of the white inorganic pigment include an oxide such as titanium oxide, zinc oxide, and zirconium oxide; a carbonate such as white lead (lead carbonate) and calcium carbonate; and a clay mineral such as kaolin (kaolinite).

As the white inorganic pigment, preferably, the oxide is used, or more preferably, the titanium oxide is used.

The titanium oxide can have characteristics such as a high degree of whiteness, a high light reflectivity, excellent hiding characteristics (hiding power), excellent coloring characteristics (coloring power), a high dispersibility, an excellent weather resistance, and a high chemical stability.

To be specific, an example of the titanium oxide includes $TiO_2$ (titanium oxide (IV), titanium dioxide).

The crystal structure of the titanium oxide is not particularly limited. Examples thereof include a rutile type, a brookite type (pyromelane), or an anatase type (octahedrite). Preferably, a rutile type is used.

The crystal system of the titanium oxide is not particularly limited. Examples thereof include a tetragonal system or an orthorhombic system. Preferably, a tetragonal system is used.

When the crystal structure and the crystal system of the titanium oxide are the rutile type and the tetragonal system, respectively, it is possible to effectively prevent a reduction of the reflectivity with respect to light (to be specific, visible light, among all, the light around the wavelength of 450 nm) even in a case where a first layer 9 is exposed to a high temperature for a long time.

The light reflecting component is in the form of a particle. The shape thereof is not limited and examples of the shape thereof include a sphere shape, a plate shape, and a needle shape. The average value of the maximum length (in the case of a sphere shape, the average particle size) of the light reflecting component is, for example, 1 to 1000 nm. The average value of the maximum length is measured by using a laser diffraction scattering particle size analyzer.

The mixing ratio of the light reflecting component with respect to the second silicone resin composition is, for example, 0.5 to 90 mass %, preferably, in view of coloring characteristics, light reflectivity, and handling ability of the second silicone resin composition, 1.5 to 70 mass %.

The filler is blended as a reinforcing agent as well which imparts reinforcing properties to the second silicone resin composition. An example of the filler includes a known filler excluding the above-described white pigment. To be specific, an example of the filler includes an inorganic filler and examples of the inorganic filler include a silica powder, a talc powder, an alumina powder, an aluminum nitride powder, and a silicon nitride powder.

As the filler, preferably, in view of reducing linear expansion coefficient of the second silicone resin composition, a silica powder is used.

Examples of the silica powder include a fused silica powder and a crystalline silica powder. Preferably, a fused silica powder (that is, a silica glass powder) is used.

Examples of the shape of the filler include a sphere shape, a plate shape, and a needle shape. Preferably, in view of excellent filling properties and fluidity, a sphere shape is used.

Accordingly, as the silica powder, preferably, a fused silica powder in a sphere shape is used.

The average value of the maximum length (in the case of a sphere shape, the average particle size) of the filler is, for example, 5 to 60 μm, or preferably 15 to 45 μm. The average value of the maximum length is measured by using a laser diffraction scattering particle size analyzer.

The mixing ratio of the filler with respect to the second silicone resin composition is adjusted to be, for example, 10 to 80 mass %, preferably 25 to 75 mass %, or more preferably 40 to 60 mass %.

In addition, examples of the functionality-imparting agent include antioxidants, modifiers, surfactants, dyes, pigments, discoloration inhibitors, ultraviolet absorbers, anti-crepe hardening agents, plasticizers, thixotropic agents, and fungicides.

The viscosity of the second silicone resin composition in which the functionality-imparting agent is blended at 25° C. is adjusted to be, in view of handling ability, for example, 100 to 500000 mPa·s, or more preferably 300 to 100000 mPa·s.

FIG. 1 shows process drawings for illustrating a first embodiment of a method for producing a silicone resin sheet of the present invention.

Next, the method for producing a silicone resin sheet is described with reference to FIG. 1.

In this method, first, as shown in FIG. 1(a), the above-described first silicone resin composition is applied to, for example, the upper surface of a release film 5.

Examples of the release film 5 include a resin film made of a resin such as polyethylene and polyethylene terephthalate (PET) and a metal foil such as a copper foil and a stainless foil. The release treatment can be applied to the top surface of the release film 5.

Examples of an application method of the first silicone resin composition include a casting, a spin coating, a roll coating, or an applicator.

In this way, a first coating layer 2 made of the first silicone resin composition is formed into a sheet shape.

The thickness of the first coating layer 2 is, for example, 50 to 500 μm, or preferably 75 to 250 μm.

Next, a precursor layer 3 is formed from the first coating layer 2.

To be specific, the first organopolysiloxane and the second organopolysiloxane are reacted so as to have a conversion ratio of 5 to 40%.

That is, a hydrosilylation addition reaction of the first organopolysiloxane with the second organopolysiloxane in the first coating layer 2 is allowed to proceed partway without being terminated. That is, the hydrosilylation addition reaction is terminated in the middle of the reaction.

To be specific, the first coating layer 2 is heated for a predetermined duration, so that the first organopolysiloxane and the second organopolysiloxane are subjected to the hydrosilylation addition reaction.

For example, the first coating layer 2 and the release film 5 are put in, for example, a dryer or the like, so that the first coating layer 2 is heated.

The heating conditions are appropriately adjusted so that the conversion ratio is within the above-described range. The heating temperature (the set temperature of the dryer) is, for example, 70 to 150° C., or preferably, in view of productivity, 80 to 110° C. The heating duration (the duration of being put in the dryer) is, for example, 3 to 8 minutes. The heating temperature can be also set to be, for example, a high temperature which exceeds 150° C. and the heating duration can be also set to be short hours, for example, less than 3 minutes, or furthermore not more than 2 minutes.

After the heating, the hydrosilylation addition reaction is terminated by, for example, cooling.

In the first silicone resin composition, when the proportion of the hydrosilyl group is equimolar or less than equimolar with respect to that of the alkenylsilyl group, the conversion ratio is calculated as the ratio (=[(the number of moles of the hydrosilyl group before reaction)−(the number of moles of the hydrosilyl group after reaction)]/(the number of moles of the hydrosilyl group before reaction)) of the number of moles of the hydrosilyl group which disappears by the reaction to the number of moles of the hydrosilyl group before the reaction.

The conversion ratio in such a case is calculated from the peak area of the absorption peak (2150 cm$^{-1}$) of the Si—H stretching vibration derived from the hydrosilyl group by measuring the infrared absorption spectrum. To be specific, the calibration curve is determined from 0% of the conversion ratio, that is, the peak area of the first coating layer 2 before the reaction, and 100% of the conversion ratio, that is, the peak area (that is, 0) after the complete reaction (the state where the hydrosilyl group does not exist). Then, the conversion ratio of the first organopolysiloxane is calculated based on the obtained calibration curve.

When the conversion ratio exceeds the above-described range, the number of moles of the unconverted alkenylsilyl group (and/or the hydrosilyl group) which exists on the top surface of the precursor layer is excessively small, so that the reaction with the hydrosilyl group (and/or the alkenylsilyl group) in the second silicone resin composition to be applied next (described later) becomes insufficient and therefore, the interlayer adhesiveness between the first layer and the second layer cannot be sufficiently improved.

On the other hand, when the conversion ratio is below the above-described range, it becomes difficult to surely maintain the sheet shape of the precursor layer or a second layer 4 (described later) made of the second silicone resin composition to be applied next cannot be sufficiently supported.

In this way, as referred in FIG. 1(a), the precursor layer 3 is formed.

The thickness of the precursor layer 3 is, for example, 50 to 500 μm or preferably 75 to 250 μm.

Next, as shown in FIG. 1(b), the second silicone resin composition is applied to the upper surface (one surface in the thickness direction) of the precursor layer 3 to form the second layer 4.

An example of an application method of the second silicone resin composition includes the same application method as that of the first silicone resin composition described above.

The thickness of the second layer 4 is, for example, 400 to 1500 μm, or preferably 500 to 1250 μm.

Thereafter, the second layer 4 is semi-cured.

To semi-cure the second layer 4, for example, the second layer 4 is heated.

The heating temperature is, for example, 20 to 200° C., or preferably 40 to 150° C.

The heating duration is, for example, 0.1 to 120 minutes, or preferably 1 to 60 minutes.

Figure 2:
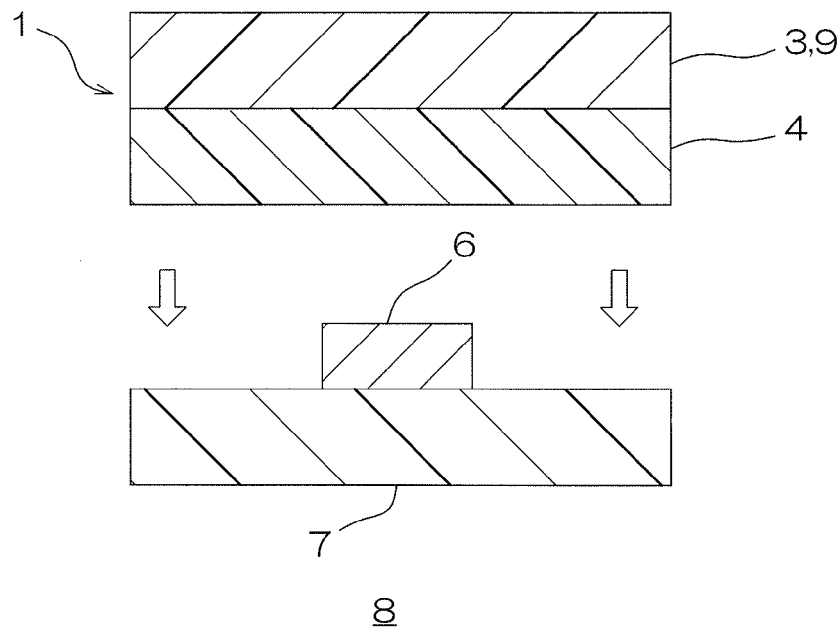
FIG. 2 shows process drawings for illustrating a method for encapsulating a light emitting diode element using an encapsulating sheet made of the silicone resin sheet shown in FIG. 1(b):
(a) illustrating a step of preparing a board mounted with the light emitting diode element and
(b) illustrating a step of encapsulating the light emitting diode element by the encapsulating sheet.
Figure 2:
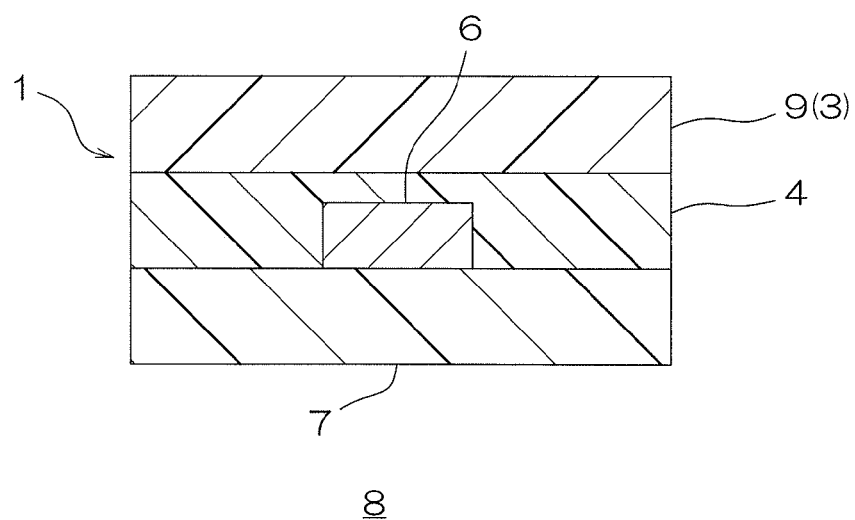

By the heating, a part of (partially) a hydrosilylation reaction of the third organopolysiloxane with the fourth organopolysiloxane is progressed, so that the second layer 4 is brought into a semi-cured (B-stage) state. The second layer 4 is brought into a semi-cured (B-stage) state, so that, though described in details later, in a case where a silicone resin sheet 1 is used as an encapsulating sheet 1 (ref: FIG. 2), even when the second layer 4 comes in contact with a light emitting diode element 6, the light emitting diode element 6 can be encapsulated, while the damage thereof can be prevented.

In this way, the silicone resin sheet 1 including the first layer 9 made of the precursor layer 3 and the second layer 4 formed on the upper surface thereof can be obtained.

The thickness of the first layer 9 is, for example, 50 to 500 μm, or preferably 75 to 250 μm and that of the second layer 4 is, for example, 400 to 1500 μm, or preferably 500 to 1250 μm.

The silicone resin sheet 1 obtained in this way can be used for various industrial uses. Among all, the silicone resin sheet 1 obtained in this way is used as an encapsulating sheet for encapsulating a member and is preferably used as an encapsulating sheet for encapsulating a light emitting diode element.

FIG. 2 shows process drawings for illustrating a method for encapsulating a light emitting diode element using an encapsulating sheet made of the silicone resin sheet shown in FIG. 1(b).

Next, a method for producing a light emitting diode device 8 by encapsulating the light emitting diode element 6 using the encapsulating sheet 1 made of the silicone resin sheet 1 is described with reference to FIG. 2.

In this method, as shown in FIG. 2(a), a board 7 mounted with the light emitting diode element 6 is prepared.

The board 7 is formed into a flat plate shape. On the upper surface thereof, a terminal (not shown) for being electrically connected to the light emitting diode element 6 and a wire (not shown) to be continuous thereto are provided.

The light emitting diode element 6 is formed on the upper surface (one side surface in the thickness direction) of the board 7. The light emitting diode element 6 is mounted on the board 7 by a wire bonding, a flip-chip bonding, or the like.

Next, in this method, as shown in FIG. 2(b), the encapsulating sheet 1 made of the silicone resin sheet 1 is disposed adjacent to the upper side (one side in the thickness direction) of the board 7.

To be specific, as shown in phantom lines in FIG. 1(b), the release film 5 is peeled from the encapsulating sheet 1, then, the encapsulating sheet 1 shown in FIG. 1(b) is reversed upside down, and as shown by an arrow in FIG. 2(a), the reversed encapsulating sheet 1 is put on the board 7 so that the light emitting diode element 6, the terminal, and the wire are embedded in the second layer 4.

Thereafter, the encapsulating sheet 1 is heated, so that the second layer 4 is cured.

The heating temperature is, for example, 100 to 160° C., or preferably 120 to 155° C. and the heating duration is, for example, 10 to 600 minutes, or preferably 60 to 450 minutes.

In this way, the light emitting diode element 6 is encapsulated by the second layer 4 in a C-stage (completely cured) state.

In this way, as shown in FIG. 2(b), the light emitting diode device 8 including the board 7, the light emitting diode element 6, and the encapsulating sheet 1 can be produced.

In the above-described method, on the upper surface of the precursor layer 3, the unconverted first organopolysiloxane and/or second organopolysiloxane, and the third organopolysiloxane and fourth organopolysiloxane can be reacted with each other.

Thus, the adhesiveness of the first layer 9 to the second layer 4 in the silicone resin sheet 1 can be improved, so that the interfacial peeling between the first layer 9 and the second layer 4 can be effectively suppressed.

Among all, the interfacial peeling between the first layer 9 and the second layer 4 in a C-stage state can be further effectively suppressed.

To be specific, the peeling adhesive force (described in details in next Examples) in a 180-degree peeling test at 25° C. with respect to the silicone resin sheet 1 in which the second layer 4 is brought into a C-stage state is, for example, more than 0.5 N/10 mm, preferably not less than 0.6 N/10 mm, more preferably not less than 0.7 N/10 mm, or particularly preferably not less than 0.8 N/10 mm, and is, for example, not more than 10 N/10 mm.

As a result, the long-term reliability of the encapsulating sheet 1 made of the silicone resin sheet 1 and the light emitting diode device 8 in which the light emitting diode element 6 is encapsulated by the encapsulating sheet 1 can be improved.

In addition, the functionality-imparting agent is contained in the second silicone resin composition, so that the desired function can be imparted only to the second layer 4. To be specific, the phosphor, the light reflecting component and/or the filler are contained in the second silicone resin composition, so that the desired wavelength conversion function, light reflecting function and/or reinforcing function can be imparted only to the second layer 4.

Second Embodiment

In the first embodiment, the functionality-imparting agent is contained in the second silicone resin composition. Alternatively, for example, the functionality-imparting agent can be contained in the first silicone resin composition instead of the second silicone resin composition.

For example, the phosphor is contained in the first silicone resin composition.

In this way, as referred in FIG. 2(b), the wavelength conversion function can be imparted to the first layer 9 made of the first silicone resin composition.

On the other hand, the functionality-imparting agent is not contained in the second silicone resin composition. The second silicone resin composition is prepared only from the third organopolysiloxane, the fourth organopolysiloxane, the hydrosilylation catalyst, and the curing retardant. In this way, the second layer 4 is formed.

Third Embodiment

In the first and second embodiments, the functionality-imparting agent is contained in either the first silicone resin composition or the second silicone resin composition. Alternatively, for example, the functionality-imparting agents (a first functionality-imparting agent and a second functionality-imparting agent), which have different functions from each other, can be respectively contained in the first silicone resin composition and the second silicone resin composition.

For example, the first functionality-imparting agent can be contained in the first silicone resin composition and the second functionality-imparting agent which has a different function from that of the first functionality-imparting agent can be contained in the second silicone resin composition.

To be specific, the phosphor is contained in the first silicone resin composition and the filler is contained in the second silicone resin composition.

In this way, in the light emitting diode device 8, the reinforcing properties of the second layer 4 can be improved, while the wavelength conversion function is imparted to the first layer 9.

Other Embodiments

In the first to third embodiments, the functionality-imparting agent is contained in at least either the first silicone resin composition or the second silicone resin composition. Alternatively, for example, the first silicone resin composition and the second silicone resin composition can be prepared without imparting the functionality-imparting agent to neither of them.

In the first embodiment shown in FIG. 1(b), in the silicone resin sheet 1, the second layer 4 is formed only on the upper surface (the one side surface in the thickness direction) of the first layer 9. Alternatively, for example, though not shown, the second layer 4 can be also formed on the lower surface (the other side surface in the thickness direction) of the first layer 9.

EXAMPLES

While the present invention will be described hereinafter in further detail with reference to Examples and Comparative Examples, the present invention is not limited to these Examples and Comparative Examples.

Example 1

A first silicone resin composition in which A liquid (a dimethylvinylsilyl-terminated polydimethylsiloxane, a first organopolysiloxane) and B liquid (a trimethylsilyl-terminated dimethylsiloxane-methylhydrosiloxane copolymer, a second organopolysiloxane) of an addition reaction curable type silicone resin composition (LR7665, manufactured by WACKER ASAHIKASEI SILICONE CO., LTD.) were mixed at a mixing ratio of 1/1 was prepared.

Next, the first silicone resin composition was applied to the upper surface of a release film made of PET using an applicator, so that a first coating layer having a thickness of 100 µm was formed.

Thereafter, the first coating layer was put in an oven at 90° C. for 5 minutes to be heated, so that A liquid and B liquid were partially subjected to a hydrosilylation addiction reaction. In this way, a precursor layer having a thickness of 100 µm was formed.

Subsequently, the conversion ratio of the hydrosilyl group was calculated from the peak area of the absorption peak (2150 cm$^{-1}$) of the Si—H stretching vibration derived from the hydrosilyl group of the trimethylsilyl-terminated dimethylsiloxane-methylhydrosiloxane copolymer of B liquid by measuring the infrared absorption spectrum of the precursor layer with a FT-IR (manufactured by Thermo Fisher Scientific K.K.). As a result, the conversion ratio of the hydrosilyl group was 28%.

Separately, 20 g (1.4 mmol of vinylsilyl group) of a dimethylvinylsilyl-terminated polydimethylsiloxane (a vinylsilyl group equivalent of 0.071 mmol/g, a third organopolysiloxane), 0.40 g (1.6 mmol of hydrosilyl group) of a trimethylsilyl-terminated dimethylsiloxane-methylhydrosiloxane copolymer (a hydrosilyl group equivalent of 4.1 mmol/g, a fourth organopolysiloxane), 0.036 mL (1.9 µmol) of a xylene solution (a platinum concentration of 2 mass %) of a platinum divinyltetramethyldisiloxane complex (a hydrosilylation catalyst), and 0.063 mL (57 µmol) of a methanol solution (10 mass %) of tetramethylammonium hydroxide (TMAH, a curing retardant) were mixed to be stirred at 20° C. for 10 minutes. 50 mass % of a silica (a filler, an average particle size of 40 µm, manufactured by DENKI KAGAKU KOGYO KABUSHIKI KAISHA.) was blended into the obtained mixture to be uniformly stirred and mixed, so that a second silicone resin composition was prepared.

Thereafter, the prepared second silicone resin composition was applied to the upper surface of the precursor layer, so that a second layer having a thickness of 1000 µm was formed.

Subsequently, the second layer was put in an oven at 105° C. for 9 minutes to semi-cure the second silicone resin composition, so that the second layer in a B-stage state having a thickness of 1000 µm was formed.

In this way, a silicone resin sheet including a first layer made of the precursor layer and the second layer in a B-stage state was produced.

Thereafter, the silicone resin sheet was put in an oven at 150° C. for 5 hours to completely cure the second layer, so that the second layer was brought into a C-stage state (a thickness of 1000 µm).

Example 2

A silicone resin sheet was produced and subsequently, a second layer was brought into a C-stage state in the same manner as in Example 1, except that the set temperature of the oven in heating the first coating layer was changed from 90° C. to 105° C.

The conversion ratio of the hydrosilyl group was 37%.

Comparative Example 1

A silicone resin sheet was produced and subsequently, a second layer was brought into a C-stage state in the same manner as in Example 1, except that the set temperature of the oven in heating the first coating layer was changed from 90° C. to 120° C.

The conversion ratio of the hydrosilyl group was 42%.

Comparative Example 2

A silicone resin sheet was produced and subsequently, a second layer was brought into a C-stage state in the same manner as in Example 1, except that the set temperature of the oven in heating the first coating layer was changed from 90° C. to 150° C.

The conversion ratio of the hydrosilyl group was 51%.

(Evaluation)
1. Peeling Test
(1) 180-degree Peeling Test

The adhesive force of the first layer to the second layer in a C-stage state was measured by a 180-degree peeling test.

To be specific, the silicone resin sheet was cut into a strip shape having a width of 1 cm to produce a sample. In the sample, a cut was made between the first layer and the second layer with a cutter to tear one end portion in the lengthwise direction by 2 cm. Then, the first layer was fixed to a fixed plate with a universal tensile testing machine and one end portion in the lengthwise direction of the second layer was held firmly to be torn off (peeled off) in a direction of 180 degrees with respect to the first layer.

The peeling conditions are as follows: under an atmosphere of a temperature of 23° C. and a humidity of 60% RH, and a peeling rate of 300 mm/min.

The results are shown in Table 1.

(2) The sample after the above-described (1) 180-degree Peeling Test was observed visually or with an optical microscope, so that a presence or absence of an interfacial peeling between the first layer and the second layer was confirmed.

The results are shown in Table 1.

In Table 1, the heating conditions and the evaluation are described.

TABLE 1

|  |  | Examples · Comparative Examples | | | |
|---|---|---|---|---|---|
|  |  | Example 1 | Example 2 | Comparative Example 1 | Comparative Example 2 |
| Heating Conditions | Temperature (° C.) | 90 | 105 | 120 | 150 |
|  | Duration (Min) | 5 | 5 | 5 | 5 |
| Conversion Ratio (%) | | 28 | 37 | 42 | 51 |
| Evaluation | Presence or Absence of Interfacial Peeling | Absence | Absence | Presence | Presence |
|  | 180-degree Peeling Test (N/10 mm) | 0.85 | 0.85 | 0.5 | 0.35 |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a silicone resin sheet, comprising the steps of:
   forming a first coating layer by applying a first silicone resin composition which contains a first organopolysiloxane having at least two alkenylsilyl groups in one molecule and a second organopolysiloxane having at least two hydrosilyl groups in one molecule;
   forming a precursor layer from the first coating layer by reacting the first organopolysiloxane with the second organopolysiloxane so as to have a conversion ratio of 5 to 40%; and
   forming a second layer on at least one surface in a thickness direction of the precursor layer by applying a second silicone resin composition which contains a third organopolysiloxane having at least two alkenylsilyl groups in one molecule, a fourth organopolysiloxane having at least two hydrosilyl groups in one molecule, a hydrosilylation catalyst, and a curing retardant containing tetraalkylammonium hydroxide.

2. The method for producing a silicone resin sheet according to claim 1, wherein
   in the step of forming the precursor layer, the first organopolysiloxane is reacted with the second organopolysiloxane by heating the first coating layer.

3. The method for producing a silicone resin sheet according to claim 1, wherein
   in the step of forming the precursor layer, the first organopolysiloxane is reacted with the second organopolysiloxane by heating the first coating layer at 80 to 110° C. for 3 to 8 minutes.

4. The method for producing a silicone resin sheet according to claim 1,
   further comprising the step of semi-curing the second layer.

5. The method for producing a silicone resin sheet according to claim 1, wherein
   the alkenylsilyl group is a vinylsilyl group.

6. The method for producing a silicone resin sheet according to claim 1, wherein
   the first silicone resin composition or the second silicone resin composition contains a functionality-imparting agent.

7. The method for producing a silicone resin sheet according to claim 1, wherein
   the first silicone resin composition contains a first functionality-imparting agent and the second silicone resin composition contains a second functionality-imparting agent which has a different function from that of the first functionality-imparting agent.

8. A silicone resin sheet comprising:
   a first layer formed by reacting a first silicone resin composition which contains a first organopolysiloxane having at least two alkenylsilyl groups in one molecule and a second organopolysiloxane having at least two hydrosilyl groups in one molecule so as to have a conversion ratio of 5 to 40% and
   a second layer laminated on at least one surface in a thickness direction of the first layer and formed from a second silicone resin composition which contains a third organopolysiloxane having at least two alkenylsilyl groups in one molecule, a fourth organopolysiloxane having at least two hydrosilyl groups in one molecule, a hydrosilylation catalyst, and a curing retardant containing tetralkylammonium hydroxide.

9. The silicone resin sheet according claim 8, wherein
   the second layer is in a semi-cured state.

10. An encapsulating sheet made of a silicone resin sheet, wherein
    the silicone resin sheet comprises:
    a first layer formed by reacting a first silicone resin composition which contains a first organopolysiloxane having at least two alkenylsilyl groups in one molecule and a second organopolysiloxane having at least two hydrosilyl groups in one molecule so as to have a conversion ratio of 5 to 40% and
    a second layer laminated on at least one surface in a thickness direction of the first layer and formed from a second silicone resin composition which contains a third organopolysiloxane having at least two alkenylsilyl groups in one molecule, a fourth organopolysiloxane having at least two hydrosilyl groups in one molecule, a hydrosilylation catalyst, and a curing retardant containing tetralkylammonium hydroxide.

11. A light emitting diode device comprising:
    a board,
    a light emitting diode element mounted on the board, and
    an encapsulating sheet formed on one surface in a thickness direction of the board so as to encapsulate the light emitting diode element, wherein
    the encapsulating sheet is made of a silicone resin sheet, and
    the silicone resin sheet comprises:

a first layer formed by reacting a first silicone resin composition which contains a first organopolysiloxane having at least two alkenylsilyl groups in one molecule and a second organopolysiloxane having at least two hydrosilyl groups in one molecule so as to have a conversion ratio of 5 to 40% and a second layer laminated on at least one surface in a thickness direction of the first layer and formed from a second silicone resin composition which contains a third organopolysiloxane having at least two alkenylsilyl groups in one molecule, a fourth organopolysiloxane having at least two hydrosilyl groups in one molecule, a hydrosilylation catalyst, and a curing retardant containing tetralkylammonium hydroxide.

* * * * *